United States Patent [19]

Suzuki

[11] Patent Number: 4,670,689
[45] Date of Patent: Jun. 2, 1987

[54] SEMICONDUCTOR LIGHT EMITTING DIODE WITH HIGH OPERATING SPEED

[75] Inventor: Akira Suzuki, Tokyo, Japan

[73] Assignee: NEC Corporation, Tokyo, Japan

[21] Appl. No.: 758,237

[22] Filed: Jul. 24, 1985

[30] Foreign Application Priority Data

Jul. 24, 1984 [JP] Japan ................................. 59-153626
Jul. 24, 1984 [JP] Japan ................................. 59-153627

[51] Int. Cl.⁴ .......................................... H01L 33/00
[52] U.S. Cl. ................................... 313/499; 313/506; 357/17
[58] Field of Search ....................... 313/499, 506, 509; 357/15, 17

[56] References Cited

U.S. PATENT DOCUMENTS 3,667,117 6/1972 Kunz ............................... 313/499 X
4,342,944 8/1982 Thorpe ............................... 313/499

Primary Examiner—David K. Moore
Assistant Examiner—K. Wieder
Attorney, Agent, or Firm—Sughrue, Mion, Zinn, Macpeak, and Seas

[57] ABSTRACT

A semiconductor light emitting device comprises a laminated semiconductive structure including a substrate, an active layer thereon and a second layer adjacent the active layer remote from the substrate, the second layer having an inner region of high carrier concentration and an outer region of lower carrier concentration. An insulative layer is on the second layer, the insulative layer having a window coaxial with and larger than the inner region. A first electrode deposited on the insulative layer establishes an ohmic contact with the inner region of the second layer and a Schottky-barrier contact with the outer region. A second electrode is provided on the substrate opposite to the first electrode, the second electrode having a window for allowing light to leave therethrough.

6 Claims, 3 Drawing Figures

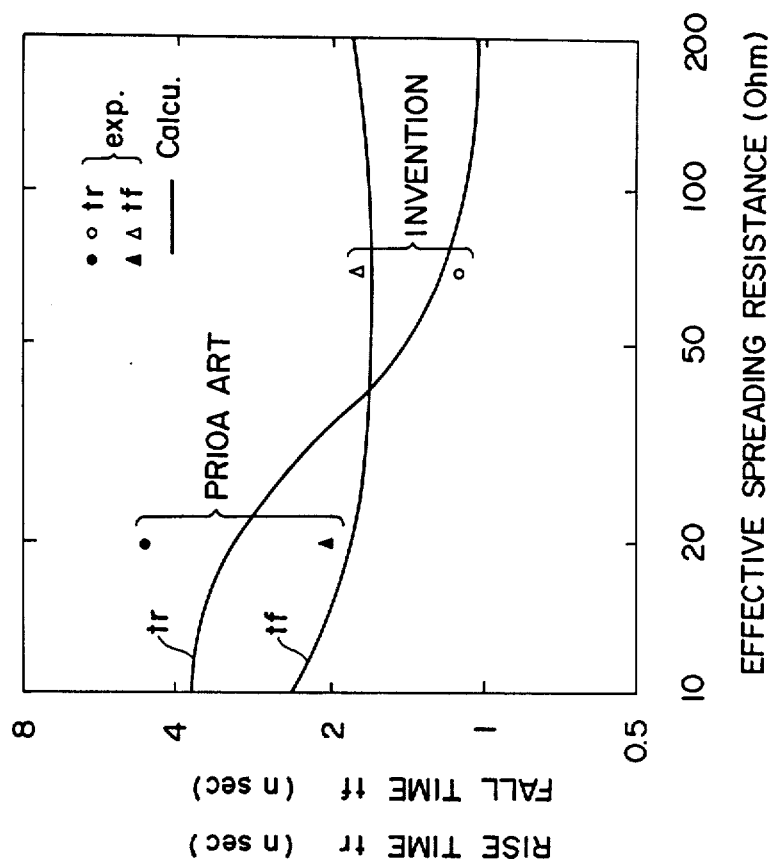

SEMICONDUCTOR LIGHT EMITTING DIODE WITH HIGH OPERATING SPEED

BACKGROUND OF THE INVENTION

The present invention relates to a semiconductor light emitting device.

Semiconductor light emitting devices such as laser diodes, surface-emitting LEDs and edge-emitting LEDs are capable of efficient high-power operation and high-speed modulation and these advantageous features are utilized for optical fiber communications. Since the efficient utilization of input current for the generation of optical output depends largely on the structure by which the input current is concentrated for injection to an active layer, many proposals have hitherto been made for the current concentration structure.

Although light emitting devices at present operate satisfactorily at low frequencies, high frequency operation is not satisfactory in terms of response characteristics and thus the modulation characteristic of the device is severely limited. In laser diodes having a current blocking layer in proximity to an active layer, current at high frequencies would leak to the uppermost semiconductor layer due to its low spreading resistance, resulting in an increase in the parasitic capacitance associated with the p-n junction of the current blocking layer and hence in a poor high-frequency modulation characteristic. Likewise, the surface-emitting LEDs suffer from the same problem.

It has been proposed to construct light emitting devices with an insulating layer deposited on the uppermost semiconductor layer outside the current injection region to reduce the parasitic capacitance (see Manuscript 25a-P-8, The 44th Symposium of the Institute of Applied Physics of Japan). However, the partial deposition of an insulating layer causes a mechanical stress at the inner circumference thereof and accelerates the deterioration of the active layer. Similar efforts involve the bombardment of protons instead of the deposition of insulating layer as described in Electronics Letters, 25th October 1979, Vol. 15 No. 22. This method also proves unsatisfactory in that the proton bombardment destroys the crystal structure of the semiconductor layers.

SUMMARY OF THE INVENTION

It is therefore an object of the invention to provide a semiconductor light emitting device immune to the problems encountered with prior art devices.

According to the present invention, the semiconductor light emitting device comprises a laminated semiconductive structure including a substrate, an active layer thereon and a second layer adjacent the active layer remote from the substrate, the second layer having an inner region of high carrier concentration and an outer region of lower carrier concentration. An insulative layer is provided on the second layer, the insulative layer having a window coaxial with and larger than the inner region. A first electrode deposited on the insulative layer establishes an ohmic contact with the inner region of the second layer and a Schottky-barrier contact with the outer region. A second electrode is provided on the substrate opposite to the first electrode, the second electrode having a window for allowing light to exit therethrough.

Current is thus concentrated in the inner, high carrier concentration region when it is applied to the first electrode. The Schottky-barrier contact has the effect of eliminating the mechanical stress otherwise placed on the inner circumference of the insulative layer. By the provision of the lower carrier concentration region outside the inner region, the parasitic capacitance is decreased significantly. Preferably, the outer region has a carrier concentration lower than $1 \times 10^{18}$ cm$^{-3}$. A high frequency modulation speed twice as high as the maximum of the prior art device is attained.

BRIEF DESCRIPTION OF THE DRAWINGS

The present invention will be described in further detail with reference to the accompanying drawings, in which:

FIG. 3 is a graphic illustration of the pulse response characteristics of the invention plotted as a function of effective spreading resistance of the uppermost semiconductor layer, in comparison with that of the prior art light emitting device.

DETAILED DESCRIPTION

Figure 1:
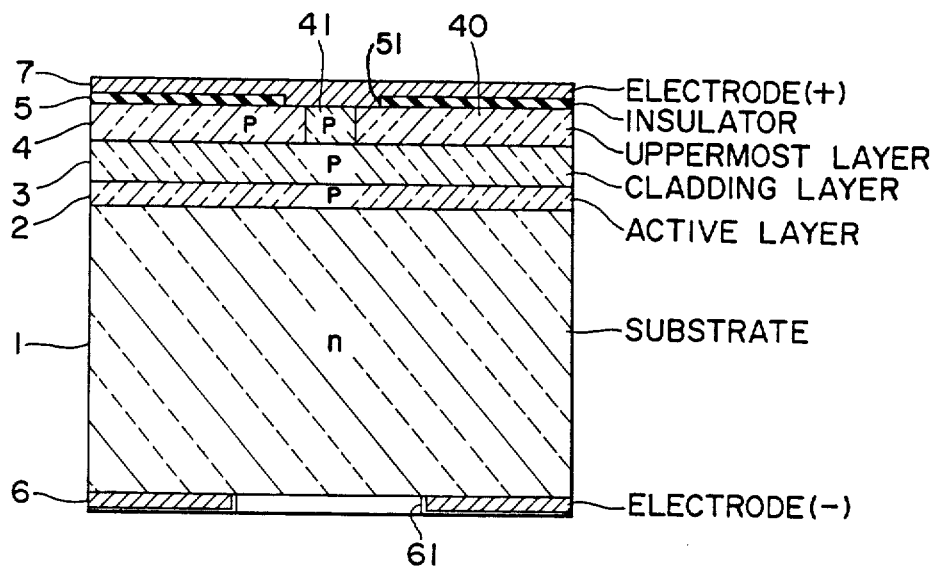
FIG. 1 is a cross-sectional view of a semiconductor light emitting device according to an embodiment of the invention.

A surface-emitting LED (light emitting diode) according to a first preferred embodiment of the invention is shown at FIG. 1. The diode is a laminated structure comprising a semiconductor substrate 1, an active layer 2 epitaxially grown on the body 1, a semiconductive cladding layer 3 on the active layer 2 and an uppermost semiconductive layer 4 on the cladding layer 3.

The substrate 1 is typically 100-micrometers thick, has a crystallographic orientation of (100) and is formed of InP doped with Sn to a carrier concentration of $1 \times 10^{18}$ cm$^{-3}$ The active layer 2 is 0.5-micrometer thick and formed of In$_{0.74}$Ga$_{0.26}$As$_{0.56}$P$_{0.44}$ doped with Zn to a carrier concentration of $7 \times 10^{18}$ cm$^{-3}$. The cladding layer 3 is 1-micrometer thick and formed of InP doped with Zn to a carrier concentration of $1 \times 10^{18}$ cm$^{-3}$.

The uppermost semiconductive layer 4 is 1-micrometer thick and formed of In$_{0.84}$Ga$_{0.16}$As$_{0.36}$P$_{0.64}$ doped with Zn to a carrier concentration of $5 \times 10^{17}$ cm$^{-3}$. This layer 4 has an inner region 41 further doped with Zn so that its carrier concentration is equal to or higher than $5 \times 10^{18}$ cm$^{-3}$, a value greater than 10 times the carrier concentration of outer region 40. The substrate 1 is of n-type conductivity and layers 2 to 4 are of p-type conductivity.

On the uppermost semiconductor layer 4 is an insulative layer 5 having a current injection window 51 formed by etching. Current injection window 51 is typically 30 micrometers in diameter larger than the diameter of the current injection region 41, which is typically 20 micrometers. A 0.3-micrometer thick negative electrode 6 having a 120-micrometer diameter circular window 61 is deposited on the underside of substrate 1 and a 0.3-micrometer thick positive electrode 7 is deposited on the insulative layer 5 so that it fills in the window 51 to establish an ohmic contact with the current injection region 41 and a Schottky-barrier contact with the area of the outer region 40 that immediately surrounds the inner region 41.

The insulative layer 2 is 0.2-micrometer thick and formed of SiO$_2$. The negative electrode 6 is formed of an alloy of Au-Ge-Ni and the positive electrode 7 an alloy of Au-Zn.

Owing to the high-carrier concentration region 41 whose resistivity is more than ten times greater than the resistivity of the lower-carrier concentration region 40, the injected current is effectively narrowed at the inner region 41 as it passes through layer 4 to the active layer 2, and this current narrowing effect occurs uniformly over frequencies from low (including zero, or DC) to high range. The high frequency current, which would otherwise find leakage paths as it passes through the uppermost region and produce a parasitic capacitance and hence an increase in response time, finds a low impedance path through the inner region, reducing the device response time.

Since the diameter of the current injection window 51 is sufficiently larger than the diameter of the inner region 41, establishing a Schottky-barrier contact between electrode 7 and outer region 40, the inner circumference of the insulative layer 5 is relieved from the inherent mechanical stress which would otherwise occur, and hence reliable operation is ensured.

Figure 2:
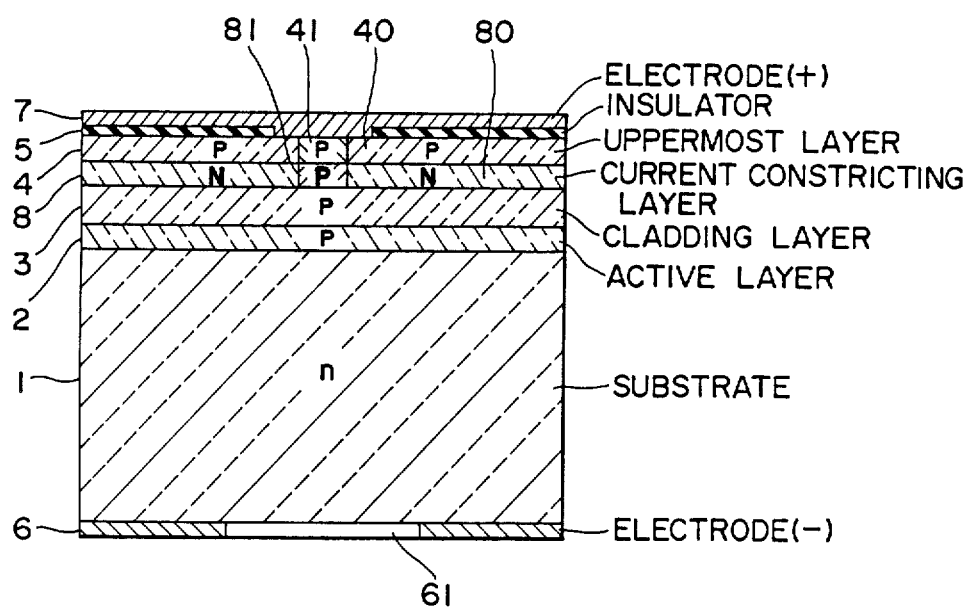
FIG. 2 is a cross-sectional view of a modified form of the invention.

FIG. 2 is a cross-sectional view of a second embodiment of the present invention which is similar to the first embodiment with the exception that it includes a 0.5-micrometer thick, mixed conductivity layer 8 formed of $In_{0.85}Ga_{0.16}A_{0.36}P_{0.64}$ doped with Sn to a carrier concentration of $1 \times 10^{18}$ cm$^{-3}$. The additional layer 8 comprises an outer n-type conductivity region 80 and an inner, Zn-doped p-type conductivity region 81 which is aligned with the inner region 41 of p-type conductivity layer 4, forming reverse-biased p-n junctions with the adjoining areas. Through the reverse-biased p-n junctions the injected current is constricted further with the action of the p-type region 81 and is injected effectively to the active layer 2 when the device is operated at low frequencies down to DC. As will be described hereinbelow, this current constricting effect also takes place effectively when the device is operated at high frequencies. It is desired that the uppermost semiconductor layer 4 be as thin as possible, but from a practical point of view the layer 4 will have a thickness of 0.5 micrometers and its outer and inner regions 40, 41 have the same carrier concentrations as in the first embodiment. The $SiO_2$ insulative layer 5 is 0.3-micrometers thick.

Owing to the fact that the outer region 40 has a resistivity much higher than the resistivity of adjacent regions and to the fact that the capacitance across electrode 7 and uppermost semiconductor layer 4 is negligible at high frequencies, parasitic capacitances associated with the reverse-biased p-n junctions are reduced and the high frequency currents, which would spread in the uppermost layer 4 and flow through undesired leakage paths created by the parasitic capacitances, find a low impedance path through inner regions 41 and 81. As a result, device response time, which would otherwise be increased due to the high frequency current leakage, is reduced to an acceptable level.

As in the first embodiment, the device is relieved from mechanical stress due to the Schottky-barrier contact between electrode 7 and uppermost layer 4.

FIG. 3 is a graphic illustration of the pulse response characteristics of a light emitting diode of 300 micrometers square constructed according to the invention in comparison with a prior art diode in which the uppermost semiconductor layer has low resistivity. Solid lines indicate calculated values. The response characteristics are represented by rise and are fall times and plotted as a function of effective spreading resistance of the uppermost layers. The prior art diode has a parasitic capacitance of about 100 picofarads and an effective spreading resistance of 20 ohms which is too small in proportion to the parasitic capacitance, so that the latter affects the response characteristics, limitting the device's highest modulation speed to 100 Mb/s. While the inventive light emitting diode has a parasitic capacitance of 100 picofarads as in the prior art, the spreading resistance is about 70 ohms which reduces the influence of the parasitic capacitance on the response characteristics, making it possible to attain a modulation speed of 200 Mb/s or higher.

The foregoing description shows only preferred embodiments of the present invention. Various modifications will be apparent to those skilled in the art without departing from the scope of the present invention. For example, the present invention is not limited to the surface-emitting LED, but may be applied to semiconductor lasers and any other semiconductor light emitting device. The materials that constitute the LED are not limited to those described above, but may include group III-V compounds.

What is claimed is:

1. A semiconductor light emitting device comprising:
   a laminated semiconductive structure comprising a substrate, an active layer thereon and a second layer adjacent the active layer remote from the substrate, the second layer having an inner region of high carrier concentration and an outer region of lower carrier concentration;
   an insulative layer on said second layer, the insulative layer having a window coaxial with and larger than said inner region; and
   a first electrode on said insulative layer establishing an ohmic contact through said window with said inner region and a Schottky-barrier contact through said window with said outer region, and a second electrode on said substrate opposite to said first electrode, the second electrode having a window for allowing light to leave therethrough.

2. A semiconductor light emitting device as claimed in claim 1, wherein the carrier concentration of said inner region is equal to or higher than $1 \times 10^{18}$ cm$^{-3}$ and the carrier concentration of said outer region is lower than $1 \times 10^{18}$ cm$^{-3}$.

3. A semiconductor light emitting device as claimed in claim 1, wherein the carrier concentration of said outer region is lower than 1/10 of the carrier concentration of said inner region.

4. A semiconductor light emitting device as claimed in claim 1, wherein said second layer is of p-type conductivity, and wherein said laminated structure further comprises a third layer sandwiched between said active layer and said second layer, said third layer having an outer region of n-type conductivity identical in size to and forming a p-n junction with the outer region of said second layer.

5. A semiconductor light emitting device as claimed in claim 1, wherein said laminated structure further comprises a cladding layer between said active layer and said second layer.

6. A semiconductor light emitting device as claimed in claim 4, wherein said substrate and said active layer are of p-type conductivity, and said laminated structure further comprises a cladding layer of p-type conductivity between said p-type conductivity active layer and said n-type conductivity third layer.

* * * * *

UNITED STATES PATENT AND TRADEMARK OFFICE
CERTIFICATE OF CORRECTION

PATENT NO. : 4,670,689

DATED : June 2, 1987

INVENTOR(S) : AKIRA SUZUKI

It is certified that error appears in the above-identified patent and that said Letters Patent is hereby corrected as shown below:

Column 3, line 67, after the _first_ occurrance of "and" delete "are"; after the _second_ occurrence of "and" insert --are--

Signed and Sealed this

Twenty-eighth Day of June, 1988

Attest:

DONALD J. QUIGG

*Attesting Officer*     *Commissioner of Patents and Trademarks*